(12) United States Patent
Glass et al.

(10) Patent No.: US 12,164,007 B2
(45) Date of Patent: Dec. 10, 2024

(54) METHOD AND APPARATUS FOR FIELD MAPPING A CELL UNDER LOAD

(71) Applicant: PARAGRAF LIMITED, Somersham (GB)

(72) Inventors: Hugh Glass, Somersham (GB); Andrew Matthews, Somersham (GB)

(73) Assignee: Paragraf Limited, Somersham (GB)

( * ) Notice: Subject to any disclaimer, the term of this patent is extended or adjusted under 35 U.S.C. 154(b) by 123 days.

(21) Appl. No.: 17/920,219

(22) PCT Filed: Apr. 20, 2021

(86) PCT No.: PCT/GB2021/050946
§ 371 (c)(1),
(2) Date: Oct. 20, 2022

(87) PCT Pub. No.: WO2021/214449
PCT Pub. Date: Oct. 28, 2021

(65) Prior Publication Data
US 2023/0176146 A1    Jun. 8, 2023

(30) Foreign Application Priority Data

Apr. 21, 2020  (GB) ..................... 2005821

(51) Int. Cl.
*G01R 33/07* (2006.01)
*G01R 15/20* (2006.01)
*G01R 31/36* (2020.01)
*G01R 31/3828* (2019.01)
*G01R 33/00* (2006.01)

(52) U.S. Cl.
CPC ......... *G01R 33/072* (2013.01); *G01R 15/202* (2013.01); *G01R 31/3648* (2013.01); *G01R 31/3828* (2019.01); *G01R 33/0094* (2013.01)

(58) Field of Classification Search
None
See application file for complete search history.

(56) References Cited

U.S. PATENT DOCUMENTS 7,425,455 B2    10/2008   Fukumoto et al.
9,070,523 B2    6/2015    Choi
(Continued)

FOREIGN PATENT DOCUMENTS

CN    106750469 A1    5/2017
CN    109085422 A     12/2018
(Continued)

OTHER PUBLICATIONS

Cayetano Cobaleda, et al. "Quantum Hall Effect in Inhomogeneous Trilayer Graphene," (2011), Physica E., vol. 44, No. 2, pp. 530-533.
(Continued)

*Primary Examiner* — Jas A Sanghera
(74) *Attorney, Agent, or Firm* — Stinson LLP

(57) ABSTRACT

A method of field mapping a cell under load is provided. The method comprises the steps of: providing a cell; providing a Hall effect sensor comprising a graphene conductor for measuring a magnetic field; positioning the Hall effect sensor at a first position adjacent a face of the cell; applying a load to the cell; and measuring an output of the Hall effect sensor.

20 Claims, 6 Drawing Sheets

(56) References Cited

U.S. PATENT DOCUMENTS

| | | | |
|---|---|---|---|
| 2006/0219436 A1 | 10/2006 | Taylor et al. | |
| 2014/0346579 A1 | 11/2014 | Franke | |
| 2015/0061602 A1 | 3/2015 | Lowmann et al. | |
| 2016/0293834 A1* | 10/2016 | Polley | H10N 50/85 |
| 2016/0329615 A1 | 11/2016 | Bergmann et al. | |
| 2017/0067970 A1 | 3/2017 | Arup et al. | |
| 2018/0231620 A1 | 8/2018 | Bruna | |
| 2020/0365952 A1* | 11/2020 | Nagano | G01R 31/3648 |
| 2022/0357402 A1* | 11/2022 | Kendall | H01M 10/4285 |

FOREIGN PATENT DOCUMENTS

| | | |
|---|---|---|
| CN | 110780213 A | 2/2020 |
| JP | 2014089819 A | 5/2014 |
| JP | 2017125714 A | 7/2017 |
| WO | 2019138232 A1 | 7/2019 |
| WO | 2020010624 A1 | 1/2020 |

OTHER PUBLICATIONS

Kai A. Haake, et al., "A New Type of Robot System for High-Resolution Field Mapping," (2008), IEEE Transactions on Electromagnetic Compatibility, vol. 50, No. 3, pp. 747-751.
Harry T. Harrison, et al. "Magnetic Tomography for Lead Acid Batteries," (2017), Journal of Energy Storage, vol. 12, pp. 1-10.
Huilong Xu, et al., "Batch-Fabricated High-Performance Graphene Hall Elements," 2013, Scientific Reports, vol. 3, pp. 1-8.
Great Britain Combined Search and Examination Report, Application No. GB2005821.0 dated Jan. 25, 2021, 14 pages.
International Search Report and Written Opinion, PCT/GB2021/050946, dated Sep. 10, 2021, 20 pages.

* cited by examiner

METHOD AND APPARATUS FOR FIELD MAPPING A CELL UNDER LOAD

REFERENCE TO RELATED APPLICATIONS

This application is the 371 U.S. national stage application of International Patent Application No. PCT/GB2021/050946, filed Apr. 20, 2021, which claims the benefit of Great Britain Patent Application No. 2005821.0, filed Apr. 21, 2020, the entire disclosures of which are incorporated herein by reference.

BACKGROUND

The present disclosure relates to an apparatus for monitoring a cell.

Rechargeable batteries (whether individual cells, batteries, or battery packs) are typically provided with a battery management systems (BMS). The battery management system is an electronic system that manages the battery, in particular to maintain its safety and efficiency. For example, the battery management system may inhibit the battery from operating outside its safe operating area, monitoring its state, calculating secondary data, reporting that data, controlling the battery environment, authenticating the battery and/or balancing the battery.

Typically, the safety and efficiency of the battery is monitored based upon temperature data at an overall pack level (i.e. over the entire battery, rather than for individual cells). As this data is limited and not granular, the safety standards for the battery have to be set at an overly cautious level as local issues in the battery may not be detected. The data can be difficult to relate to particular failure modes of cell, in particular as it can be masked or obscured by normal temperature fluctuations of the battery.

As a result, batteries are taken out of service earlier than necessary. This results in increased costs for the owner of the device powered by the battery, and minimal efficiency improvements. This is also environmentally damaging as the old batteries can be difficult to dispose of in an environmentally-friendly manner.

There is therefore a need for an apparatus and method of using this apparatus for better monitoring batteries to characterise failure modes such that more accurate safety limits may be set.

A Hall effect sensor (also known as a Hall sensor) is a known component in the art. It is a transducer that varies its output voltage in response to a magnetic field. In a Hall sensor a conductor is provided with a current applied along it, in the presence of a magnetic field the electrons are deflected producing a voltage perpendicular to the drive current. In particular Hall sensors, a thin strip of a conductor has a current applied along it, in the presence of a magnetic field the electrons are deflected towards one edge of the conductor strip, producing a voltage gradient across the short-side of the strip (perpendicular to the feed current). The conductor is typically provided on a substrate layer. In contrast to inductive sensors, Hall sensors have the advantage that they can detect static (non-changing) magnetic fields.

The current density of a cell in a battery is a parameter which can be monitored in order to determine a health of the cell. The current density is the amount of charge per unit time that flows through a unit area of a chosen cross-section, measured in amperes per square metre. This current density can be measured based upon the magnetic fields generated by the cell.

A review of the possible techniques is set out in "Magnetic tomography for lead acid batteries" of Harrison et al. which explores the measurement of magnetic fields to determine current distribution. This represent a high-level technical review, but does not provide any solutions which are viable on a commercial scale. The use of Hall effect sensors is discouraged as they are "not sensitive enough for reading the external magnetic field".

US 2015/0061602 A1 is directed to an electrochemical cell with a magnetic sensor. The magnetic sensor includes an array of magnetic field sensors, each having an organic p-n junction. Again, the use of Hall effect sensors is discouraged as "such known sensors are typically inflexible because they consist of brittle materials . . . or require a defined geometry that cannot be integrated in an electrode stack" such that "attachment of a sensor to the battery case would be too remote in order to reliably detect small local currents in the cell at high resolution".

"Batch-fabricated high-performance graphene Hall elements" of Xu et al. discloses the use of graphene for Hall elements.

WO 2020/010624 A1 discloses a battery testing method and system, and battery analysis device.

CN 106 750 469 A discloses a production device and production process of graphene thin film coiled material.

US 2017/067970 A1 discloses a graphene hall sensor.

US 2014/346579 A1 discloses a magnetic field sensor device.

US 2018/231620 A1 discloses a charge-carrier hall-effect sensor.

"A New Type of Robot System for High-Resolution Field Mapping" of Haake et al. deals with a field scanner that accomplishes a measurement of the field distribution inside a gigahertz transverse electromagnetic cell.

There is therefore a need for an inexpensive apparatus and method for monitoring current density of a cell.

Battery management systems may also monitor the current input and/or output of the cell to monitor the health of the battery. This will provide an indication of how the resistances are changing, but not a direct measurement of the health of the battery itself. Typically, this measurement is taken via a shunt resistor. The shunt resistor is placed in series with the load for the circuit, and the voltage drop across the shunt resistor is measured. The current can then be calculated according to Ohm's law. Typically, the shunt resistor will have a low resistance, such as on the order of 1 mOhm.

Such a shunt resistor measurement typically has a low resolution. Additionally, if the shunt resistor fails the entire circuit (which can be the cell or the entire battery pack) will also fail.

There is therefore a need for an improved method of measuring an input or an output current of a cell.

SUMMARY

The present invention provides a method of field mapping a cell under load comprising the steps of: providing a cell; providing a Hall effect sensor comprising a graphene conductor for measuring a magnetic field; positioning the Hall effect sensor at a first position adjacent a face of the cell; applying a load to the cell; and measuring an output of the Hall effect sensor. Such a Hall effect sensor is able to detect current densities in the cell with high sensitivity and across a wide range. Thus a single Hall effect sensor can appropriately map the cell for loads with various power levels.

The method may further comprise the steps of: moving the Hall effect sensor from the first position to a second position adjacent the face of the cell; measuring the output of the Hall effect sensor at the second location. This allows a map of the cell to be formed, based upon local current densities across the cell.

The method may further comprise the steps of: moving the Hall effect sensor from the second position to a series of N subsequent positions adjacent the face of the cell; and measuring the output of the Hall effect sensor at each of the subsequent locations, wherein the N subsequent positions are distributed across the surface of the cell. This allows the map of the cell to be evenly distributed to give an indication of the overall health of the entire cell.

The N subsequent positons may form an array across the face of the cell. An array allows the overall cell to be suitably mapped.

The Hall effect sensor may be a part of an array of Hall effect sensors, each of which is placed adjacent the cell so as to detect a magnetic field within the cell. An array allows the overall cell to be suitably mapped.

The array may be evenly distributed across the face of the cell. An even distribution over the face of the cell reduces the risk of localised defects in the cell being missed.

The method may further comprise the step of: monitoring the measured output of the Hall effect sensor; identifying a change in the magnetic field indicative of cell failure; and determining a location in the cell of the cell failure.

The present invention also provides use of a Hall effect sensor comprising a graphene conductor to measure the magnetic field of a cell. As above, such a Hall effect sensor is able to detect magnetic fields in the cell with high sensitivity and across a wide range. Thus a single Hall effect sensor can appropriately map the cell for loads with various power levels.

The magnetic field may be converted to a local current density. The local current density provides information regarding the health of the cell.

The present invention also provides use of a Hall effect sensor comprising a graphene conductor to measure the input current or output current of a cell. This Hall effect sensor can determine the input or output current of the cell without the need for a shunt resistor. Thus, even if the sensor fails the circuit itself is not compromised. This contrasts to a shunt resistor where failure of the shunt resistor also results in failure of the circuit as a whole.

The present invention also provides an apparatus for field mapping a cell under load comprising an array of Hall effect sensors, each Hall effect sensor comprising a graphene conductor for measuring a magnetic field. The array of Hall effect sensors allows the health of the cell at a number of points to be monitored.

The present invention also provides an apparatus for field mapping a cell under load comprising a Hall effect sensor mounted on an actuation system, the actuation system configured to move the Hall effect sensor between a plurality of positions corresponding to locations on the cell. Moving the Hall effect sensor allows the health of the cell at a number of points to be monitored.

The plurality of positions may form an array. Such a regularly arranged structure can improve the overall mapping of the cell.

The present invention also provides an apparatus for field mapping a cell under load comprising: a pick-up coil for placement adjacent to a cell such that a current is generated in the pick-up coil in response to a magnetic field of the cell; a measurement coil in electrical communication with the pick-up coil such that a current in the pick-up coil is transmitted to generate a current in the measurement coil; and a magnetic field sensor arranged to detect the magnetic field generated by a current in the measurement coil. This provides a simple way to measure the current density of a cell, using technology which can be easily manufactured. Furthermore, the number of connections from the cell can be reduced, which improves the sealing of the cell against oxygen and water ingress.

The pick-up coil may be one of a plurality of pick-up coils each for placement adjacent to the cell such that a current is generated in each pick-up coil in response to a magnetic field of the cell. A plurality of pick-up coils allows a health profile over the cell to be determined by measuring in multiple positions.

The plurality of pick-up coils may comprise: a plurality of array coils arranged in an array. Array coils are typically regularly repeating pattern which allows a profile of the cell to be established.

The plurality of pick-up coils may comprise: a plurality of nested coils, each arranged to overlap at least one other pick-up coil of the plurality of pick-up coils. Using such nested coils, one coil can be used to measure a field integrated over a large area, while an internally nested coil can be used to determine localised fields. In this way, relative spatial variations can be measured, helping to eliminate common mode fields generated by external sources including the Earth's magnetic field.

At least one of the pick-up coils of the plurality of pick-up coils may be both an array coil and a nested coil. This allows the cell profile to be formed, while removing spatial variations. In particular, the entire array may be provided within an outer nested coil, such as a master coil.

The plurality of pick-up coils may comprise: a master coil surrounding each of the plurality of pick-up coils. This master coil effectively can remove spatial variations for the pick-up coils it encloses.

Each pick-up coil of the plurality of pick-up coils may be in electrical communication with a corresponding measurement coil such that a current in the pick-up coil is transmitted to generate a current in the respective measurement coil, and each measurement coil has a corresponding magnetic field sensor arranged to detect the magnetic field generated by a current in the respective measurement coil.

Each of the plurality of pick-up coils may be in electrical communication with a multiplexer, and the measurement coil is in electrical communication with the multiplexer, wherein the multiplexer is configured to selectively transmit the current of one of the pick-up coils to the measurement coil. This further reduces the number of connections exiting the cell.

The multiplexer may be configured to sequentially cycle through each of the pick-up coils to transmit the current of each of the pick-up coils to the measurement coil in turn. In this manner, each of the pick-up coils can be sampled sequentially to map the entire cell.

Each magnetic field sensor may be a Hall effect sensor, preferably a Hall effect sensor comprising a graphene conductor for measuring a magnetic field. Such a sensor is particularly effective for this use due to its resolution and sensitivity.

The array may be evenly distributed across a face of the cell. This even distribution reduces the chance of anomalies in the cell being missed.

The present invention also provides an assembly comprising the apparatus and a cell. The assembly allows the benefits of the Hall effect sensor discussed above to be realised.

The assembly may further comprise a battery management system arranged to receive an output of each Hall effect sensor as an input. The battery management system can take these outputs as a part of a larger management system to proactively manage the cell.

The battery management system may be configured to generate a map of the local current density of the cell based upon the output of each Hall effect sensor. This map can show the areas of deviation in the cell, and hence may be used to predict failure rates and/or failure modes.

In all of the aforementioned, the Hall effect sensor may comprise: a substrate having a layer structure thereon, the layer structure comprising: a lower layer on a first region of the substrate, wherein the lower layer comprises one or more graphene layers which extend across the lower layer, and an upper layer on the lower layer and formed of a dielectric material, wherein the graphene and upper layer are cross shaped with four arms and share a continuous outer edge surface, an ohmic contact provided on a further region of the substrate and in direct contact with the one or more graphene layers via the continuous outer edge surface, and four ohmic contacts, each contact provided on a further region of the substrate and in direct contact with a distal portion of the edge surface of each of the four arms of the cross, and a continuous air-resistant coating layer enclosing the layer structure or across the substrate, the layer structure, and the at least one ohmic contact. Such a Hall effect sensor provides improved sensitivity, and hence is particularly useful for the aforementioned methods, uses and apparatuses.

The substrate may be sapphire, silicon, silicon dioxide, silicon nitride, silicon carbide, germanium, or a III-V semiconductor, preferably sapphire or silicon.

The Hall effect sensor may comprise: a sapphire substrate having a layer structure thereon, the layer structure comprising: a monolayer of graphene on a first region of the sapphire substrate, and an alumina layer on the graphene monolayer, wherein the graphene and alumina are cross shaped with four arms and share a continuous outer edge surface, four gold ohmic contacts, each contact provided on a further region of the sapphire substrate and in direct contact with a distal portion of the edge surface of each of the four arms of the cross, and a continuous alumina coating layer across enclosing the layer structure. Such a Hall effect sensor provides improved sensitivity, and hence is particularly useful for the aforementioned methods, uses and apparatuses.

DETAILED DESCRIPTION

A Hall effect sensor suitable for use in the present application is disclosed, for example, in WO 2019/138232 A1, the entire contents of which is incorporated herein by reference. Specifically, WO 2019/138232 A1 discloses that a Hall effect sensor can be constructed in which the conductor of the sensor is formed of graphene. As discussed in the background, a Hall effect sensor comprises a typically thin strip of a conductor which has a current applied along it. When a magnetic field is applied to the Hall effect sensor the electrons in the current flow are deflected towards one edge of the conductive strip. This then produces a voltage gradient across the strip (i.e. in a direction transverse or perpendicular to the current flow).

Graphene is a known material with a plethora of proposed applications driven by the material's theoretical extraordinary properties. Good examples of such properties and applications are detailed in "*The Rise of Graphene*" by A. K. Geim and K. S. Novoselev, Nature Materials, vol. 6, March 2007, 183-191.

The Hall effect sensor with a graphene conductor displays high sensitivity and resolution. This is due to the low sheet carrier concentration of graphene. The lower the sheet carrier concentration, the greater the sensitivity of a Hall effect sensor. Any contamination in the graphene (e.g. residue from copper catalysts, polymer transfer, etc.) will increase the sheet carrier concentration, and thereby reduce the sensitivity of the resulting Hall effect sensor.

The high resolution and sensitivity allows for the Hall effect sensor to detect current density across a large range of values, without the need to replace the Hall effect sensor. Conventional Hall effect sensors are typically only suitable for a relatively narrow range of use cases. As such, the conventional Hall effect sensor must be selected to sense for a particular use case.

For example, a particular use case where current density may be detected is in a battery for a vehicle such as a car. This battery can be loaded with low power components (such as a car radio) or high power components (such as a car starter motor) and it is useful to test the battery health across each of these loads. A conventional Hall effect sensor would not be able to detect both of these loads. Instead, there would need to be a low power Hall effect sensor and a high power Hall effect sensor. A Hall effect sensor having a graphene conductor can detect the current density for both the low power load and high power load.

As a result, it can be used in operations where prior art Hall effect sensors are not suitable.

Figure 1:
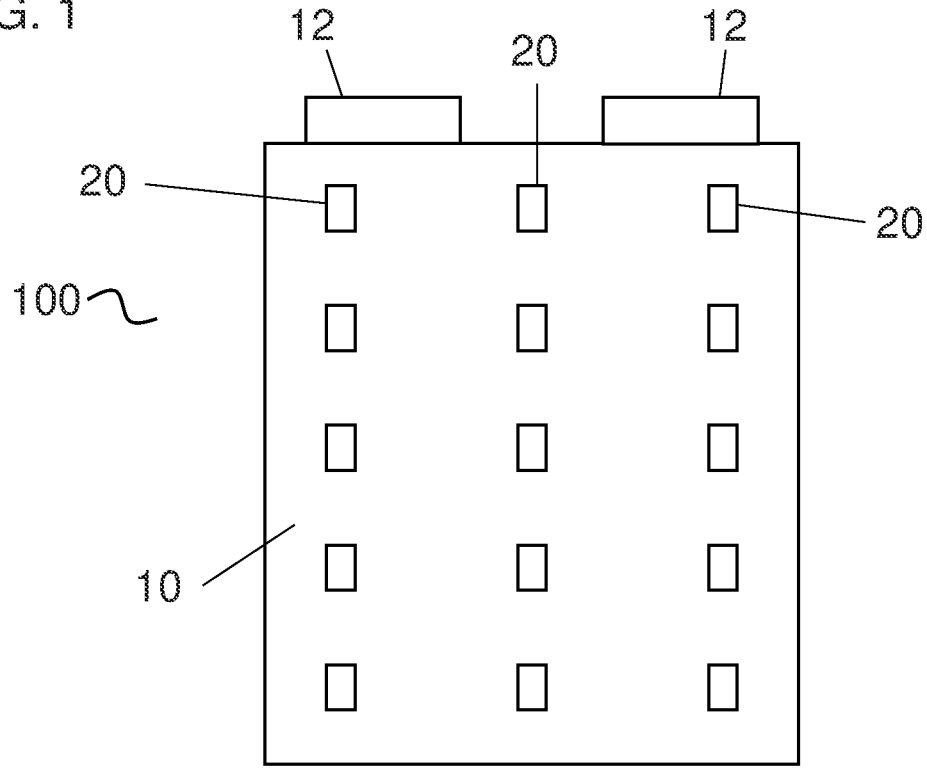
FIG. 1 shows a schematic of an apparatus for monitoring a cell.
Figure 2:
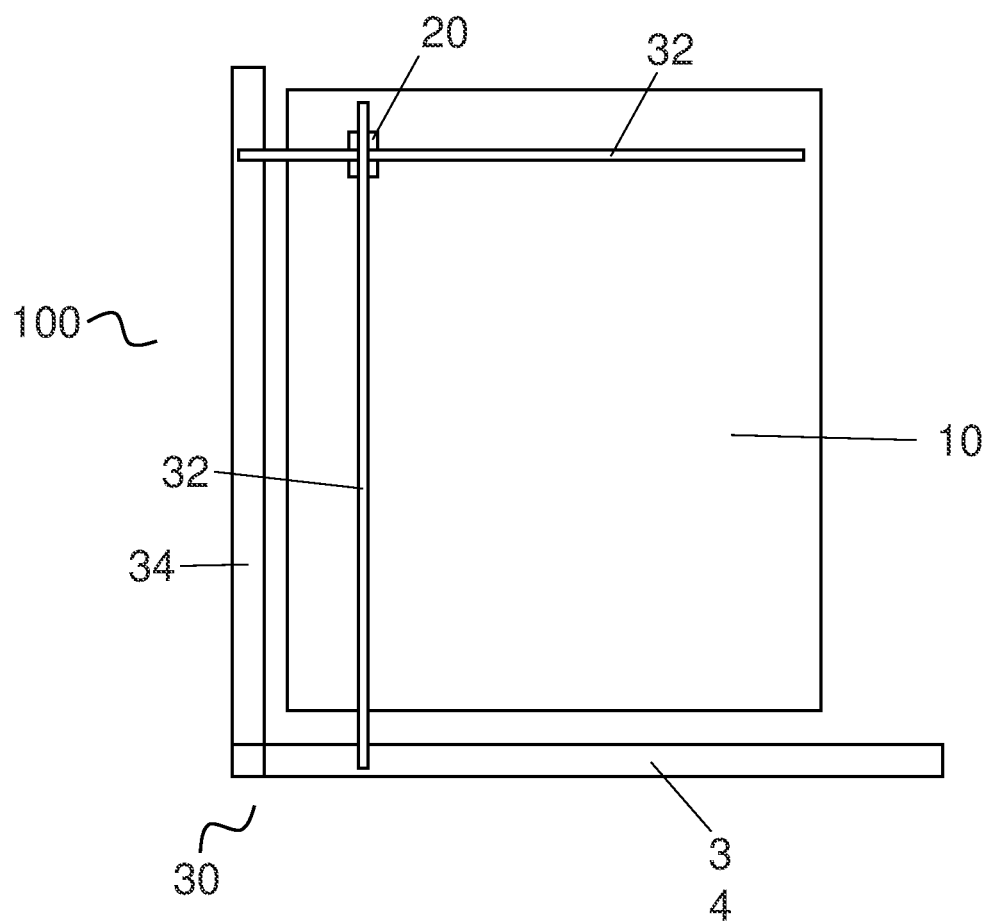
FIG. 2 shows a schematic of an alternative apparatus for monitoring a cell.

In a particular use case, an apparatus for monitoring a cell can be provided as shown in the embodiments of FIGS. 1 and 2.

FIG. 1 depicts an apparatus 100 for monitoring a cell 10. The cell 10 has a plurality of current tabs 12 for connection to an electrical circuit. The apparatus 100 comprises a plurality of Hall effect sensors 20. The Hall effect sensors 20 are arranged in an array which spans a face of the cell 10. The array forms a series of measurement locations across the face of the cell 10. The cell 10 may be provided in a pouch, and the Hall effect sensors 20 may be provided inside or outside of this pouch. In particular, the array may be selected such that the perimeter bounded by the array defines an area greater than 80% of the surface area of the face of the cell 10 which it is measuring. The array may define a regularly repeating pattern, or may have any other pattern selected as appropriate for the particular cell 10. The array may be evenly distributed across the face of the cell 10.

In use, a current (or voltage) is applied to each Hall effect sensor 20. A load is then applied to the cell 10. This load may be a charging or discharging load. As a result of the load, a magnetic field is produced by the cell 10. Each Hall effect sensor 20 will then detect the magnetic field in the portion of the cell 10 that it is aligned with. This magnetic field is proportional to the local current density. As a result, a detailed map of the current density for the cell 10 can be formed. This detailed map can then be used to monitor the cell 10 and characterise particular failure modes.

The array of Hall effect sensors 20 may be provided on a carrier material or layer. This carrier material can then be positioned adjacent to or contacting the face of the cell 10 being monitored. Alternatively, the array may be formed substantially integrally with the cell 10, or a housing/casing of the cell 10. Thus the array can be used to test a single integrated cell 10, or used to test a plurality of cells 10 brought into proximity with the array in turn.

The array may be selected to measure the variation of current density across the cell 10. For example, there may be a greater number of array locations in regions where a greater current density is expected. Such a region may be in the vicinity of the current tabs 12 of the cell 10. As such, the array may include more measurement locations in the vicinity of the current tabs.

Figure 1A:
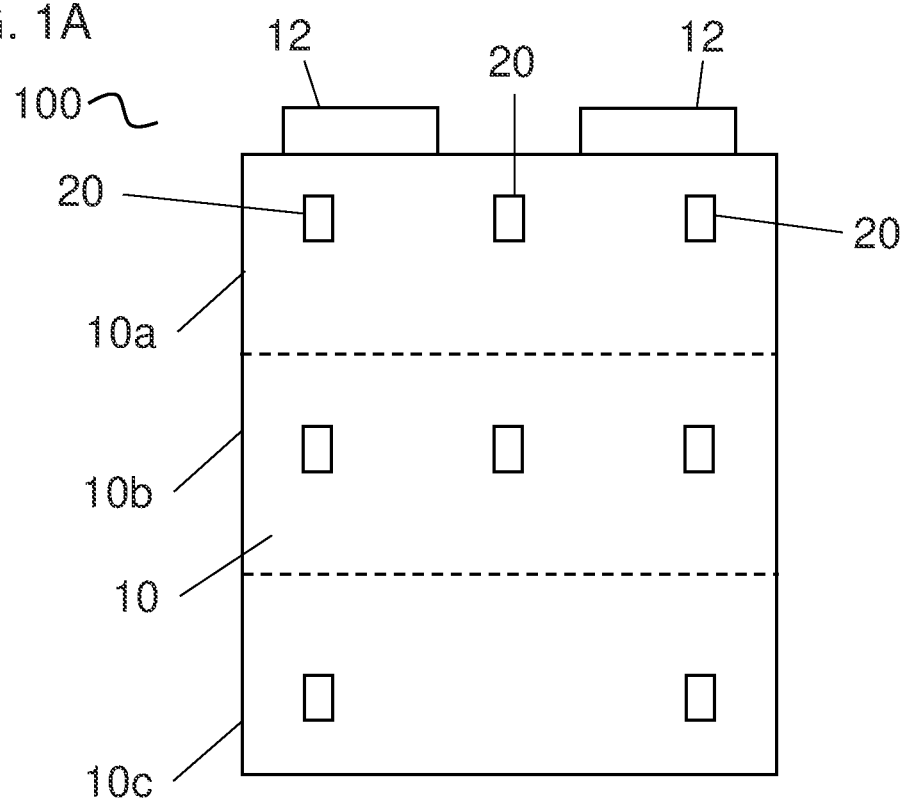
FIG. 1A shows a schematic of a further apparatus for monitoring a cell.

FIG. 1A shows an example array in accordance with this. In this array, the cell 10 is split into a plurality of regions—three in this example. A current region 10*a* is defined nearest the current tabs 12. An end region 10*c* is defined at an opposite end of the cell 10 to the current tabs 12. A central region 10*b* is defined between the current region 10*a* and the end region 10*c*. The regions 10*a*, 10*b*, 10*c* may be defined with an equal distribution across the cell. Alternatively, the regions 10*a*, 10*b*, 10*c* may be defined in any suitable manner.

The current region 10*a* may have more Hall effect sensors 20 in the array than the end region 10*c* and/or the central region 10*b*. In particular embodiments, such as shown in FIG. 1A, the current region 10*a* and the central region 10*b* may have the same number of Hall effect sensors 20, and the end region may have fewer Hall effect sensors 20.

In experiments carried out with the arrangement of FIG. 1A, it has been shown that closest to the current tabs 12 the current density is greatest, reducing the further from the current tabs 12 that the measurement is taken.

In a further embodiment, one or more Hall effect sensors 20 may be placed on each current tab 12. This may be used in any of the arrangements disclosed herein. The difference between the readings of these Hall effect sensors 20 may be monitored in order to determine the internal resistance of the cell 10. This can be monitored as it changes over time in order to determine a degradation of the cell 10.

A number of cells 10 may be connected together to form a battery pack. The current tabs 12 of the plurality of cells 10 may be connected together via bus bars in this battery pack. One or more Hall effect sensors 20 may be placed on these bus bars, in order to detect current flowing therein. This can be used as a safety measure in prevent excess current from being supplied to the cell 10. This can also be used to measure any changes in the current draw by the cell during its lifetime. Such changes can be a sign of degradation of the cell 10.

Additionally, or alternatively, one or more Hall effect sensors 20 may be provided on the input of each cell 10 in a battery pack. This allows for changes in current draw to be detected for each individual cell 10. With this information, the current flow to the battery pack can be optimised for efficient charging and/or discharging, and to allow the use of the full capacity of the battery pack. If an individual cell 10 fails in the battery pack, this can be identified and the failed cell 10 can be isolated. This can therefore extend the working life of the battery pack.

An alternative embodiment of the apparatus 100 is provided as shown in FIG. 2. In this alternative embodiment, one or more Hall effect sensors 20 are provided connected to a track system 30. The track system 30 includes moveable arms 32, which are mounted on tracks 34. The Hall effect sensor(s) 20 are mounted on the tracks such that they are able to move with the arms 32 to thereby measure the local current density at any location across the face of the cell 10. While the simple linear track system 30 is shown in FIG. 2, it is anticipated that any suitable actuation system for the Hall effect sensor(s) 20 can also be used that is suitable to move the Hall effect sensor(s) 20 between the plurality of positions.

The Hall effect sensor 20 may be moved to a plurality of locations on the face of the cell 10, with measurements of the local current density taken at each of these locations. For example, the Hall effect sensor 20 may be moved to N distinct locations across the face of the cell 10. The locations may be selected such that they collectively define an array. For example, the locations may collectively define the array shown in FIG. 1.

At each of the N positions, the output of the Hall effect sensor 20 may be measured and recorded.

An assembly of the apparatus 100 and the cell 10 may be provided. For example, the assembly may be a battery for a car. In such an assembly, the apparatus 100 and cell 10 may be co-located ready for operation as described herein.

Each apparatus 100 is preferably attached to the cell 10. For example, this may be within a casing of the cell 10. Alternatively, each apparatus 100 may be attached to the casing of the cell 10. In further alternatives, each apparatus 100 may be held in situ by a larger housing which fixes the cell 10 and the apparatus 100 in place. As such, any vibrations of the cell 10 or the Hall effect sensor 20 will be equally felt by each component to avoid introducing additional errors.

Each apparatus 100 may be incorporated into a wider battery management system. For example, the battery management system may be the overall battery management system for a vehicle such as a car where the cell 10 is providing electrical power to the vehicle. The output of the Hall effect sensor(s) 20 may be taken as inputs to the battery management system. The battery management system may additionally comprise any further sensors for detecting parameters of or relating to the cell 10. The battery management system may be configured to control charging and/or discharging of the cell 10 based upon the output of the Hall effect sensor(s) 20.

The battery management system may be configured to alert a user that the cell 10 is deteriorating and/or failing based upon the output of the Hall effect sensor(s) 20. With a plurality of measurements taken at different positions across the face of the cell 10 (whether via the fixed array of Hall effect sensors 20 of FIG. 1, or the moving apparatus of Hall effect sensor(s) 20 of FIG. 2) the current density across the cell 10 can be mapped. This mapping may be carried out by the battery management system. With such mapping, the precise location in the cell 10 where failure is occurring can be identified, which may allow for identification of early warning signs. Accordingly, partial replacement of defective components of the cell 10 can performed.

Additionally, the Hall effect sensor(s) 20 can be continuously monitored, for example by the battery management system, to assess changes in current flow as a function of the state of charge of the cell 10. The change in current flow represents a change in the internal resistance of the cell 10. Such information can be used to understand the internal mechanisms of the cell 10, which may be used to develop improved cells 10 or management strategies thereof.

As the temperature of the cell 10 and Hall effect sensor 20 may also affect the measured voltages, the battery management system may further comprise temperature compensation features. In particular, an increase in temperature of the Hall effect sensor 20 may increase the generated Hall voltage. This relationship may be a linear correlation, or may be represented by a more complex relationship. In any event, a correction factor can be applied to the Hall effect sensor 20 in order to correct for this temperature dependence.

One or more temperature sensors may be provided in the vicinity of the Hall effect sensor 20, such as on the Hall effect sensor 20 or on the cell 10. The sensed temperature can then be used to determine an appropriate correction factor which is then applied to the raw voltage reading from the Hall effect sensor 20. It is preferable for the temperature sensor to be applied directly to the Hall effect sensor 20 as this directly senses the temperature of the sensor which is what affects the measurements. In any event, there will be a thermal lag between the temperature sensor and the temperature effect on the Hall effect sensor 20.

The correction factor may take this temperature lag into account, for example by adjusting the correction factor accordingly.

The sensitivity of the present Hall effect sensor 20 is such that the direction of current may also be detected. That is, the difference between charging current and discharging current of the cell 10 may be detected. When charging the magnetic field strength (in teslas, T) may increase, and while charging the magnetic field strength may decrease (or vice versa). The magnetic field strength may also change sign (i.e. from a positive to a negative value, or vice versa) between charging and discharging. In this sense, the rate of change of the magnetic field strength, and/or the sign thereof, may be used to indicate the direction of flow of current in the cell 10 (i.e. to determine between charging and discharging). Such sensing can be particularly identified if the Hall voltage reading is temperature-corrected as discussed above. It may be that only certain positions on the cell 10 show the direction of charge, and it may require the Hall effect sensor 20 to be positioned in a given direction.

Thus, the present disclosure includes the use of a Hall effect sensor 20 with a graphene conductor to measure a magnetic field of cell 10. The local current density of the cell 10 can be derived from this magnetic field.

The present invention also includes a further apparatus 200 for field mapping a cell 10 under load. This further apparatus 200 is generally shown in FIGS. 3 to 6 in various arrangements.

Figure 3:
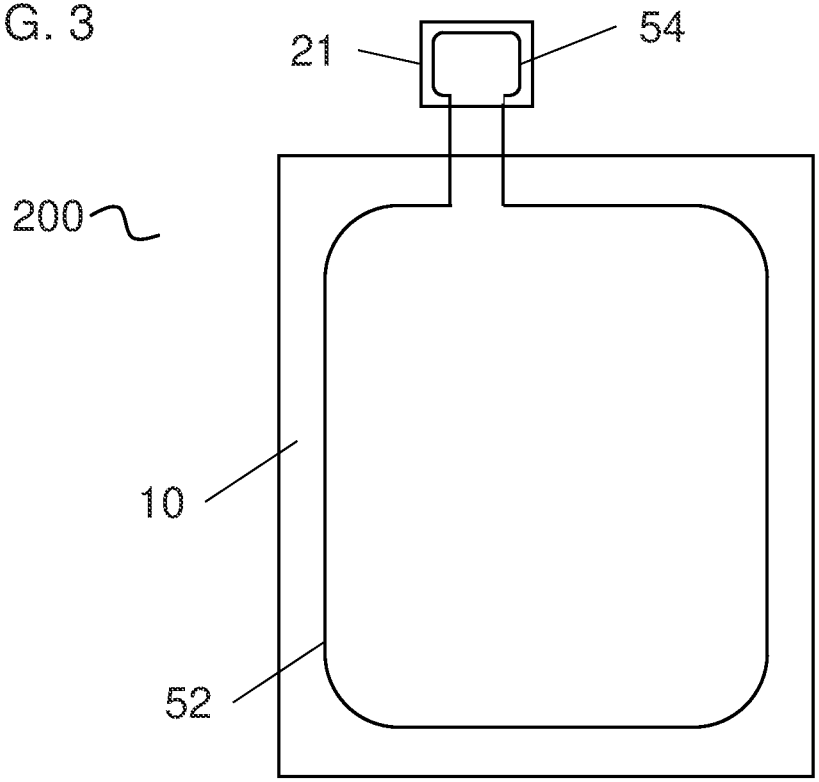
FIG. 3 shows a schematic of a further alternative apparatus for monitoring a cell.

FIG. 3 shows this further apparatus 200 in its simplest state, applied to a cell 10 to form an assembly. The apparatus 200 comprises a pick-up coil 52 which is arranged, in use, to overlay at least a section of the cell 10. The pick-up coil 52 may be a single-turn coil, or may be a coil with a plurality of turns (a multi-turn coil). The number of turns in the pick-up coil 52 so as to increase or decrease the generated current.

The pick-up coil 52 is a flux transformer coil and may integrate the field generated by movement of electrical charged within the cell 10 to cause a current to flow in the pick-up coil 52. The pick-up coil 52 may be inserted in the cell 10 or pouch, printed inside the cell 10 or pouch, on the surface of or applied externally to the cell 20 or pouch.

The pick-up coil 52 is in electrical communication (and/or electrical connection) with a measurement coil 54. As with the pick-up coil 52, the measurement coil 54 is a flux transformer coil and can be a single-turn or multi-turn coil. The simplest solution is a single-turn coil for each of the pick-up coil 52 and the measurement coil 54 as this means there is no requirement for an electrical cross-over that would otherwise necessitate multiple lamination or printing steps in the manufacturing process.

The pick-up coil 52 and measurement coil 54 may be designed to reduce or concentrate the magnetic flux generated by the measurement coil. This is typically achieved by varying the size and/or number of turns in each coil. The magnetic flux generated in the measurement coil 54 is proportional to the magnetic flux detected by the pick-up coil. When the coils are designed to concentrate the magnetic flux (that is, generate a greater magnetic flux in the measurement coil 54), the area of the pick-up coil 52 disposed over the cell surface could be larger than the area of the measurement coil 54 over the magnetic sensor 21 or have more turns. Concentrating the magnetic flux allows more sensitive magnetic field measurements to be made for a given magnetic sensor sensitivity.

This communication may be generally direct, as shown in the schematic of FIG. 3. Alternatively, the communication may be via intermediary components such as a multiplexer (MUX) 60 shown in FIG. 4.

In use, the magnetic flux in the cell 10 will induce a current in the pick-up coil 52. This induced current is then transmitted from the pick-up coil 52 to the measurement coil 54. This results in a current passing through the measurement coil 54 and thereby generating a magnetic field.

A magnetic field sensor 21 is provided aligned with the measurement coil 54. The magnetic field sensor 21 is arranged to detect the magnetic field generated in the measurement coil 54. The magnetic field sensor 21 may be any suitable magnetic field sensor. In certain embodiments the magnetic field sensor 21 may be a Hall effect sensor 20, such as a Hall effect sensor 20 with a graphene conductor as described above.

In this sense, the magnetic flux of the cell 10 can be detected by the magnetic field sensor 21, via the pick-up coil 52 and the measurement coil 54. As a result, no sensors are placed inside the cell 10 or pouch. The number of connections from outside to inside of the pouch are thereby reduced which makes the sealing of the pouch simpler.

FIG. 3 shows the simplest arrangement of this apparatus 200, which will detect the magnetic flux over generally the entire cell.

Figure 4:
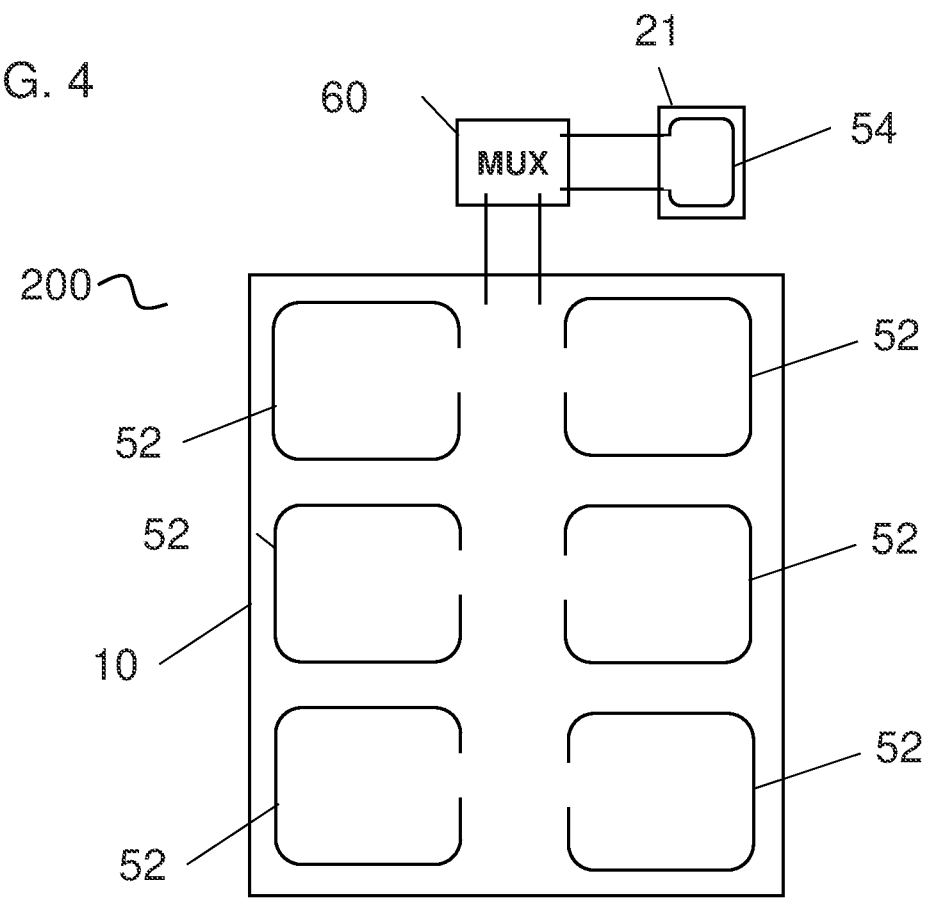
FIG. 4 shows a schematic of an alternative arrangement of the apparatus of FIG. 3.

An alternative arrangement of the apparatus 200 is shown in FIG. 4. In this apparatus 200, a plurality of pick-up coils 52 are provided at a number of locations corresponding to different positions on the cell 10. Each pick-up coil 52 is generally as described above in relation to FIG. 3, unless otherwise expressly specified. The plurality of pick-up coils 52 may each be in electrical communication with a multiplexer 60. For ease of reference the connections between each pick-up coil 52 and the multiplexer 60 are omitted from FIG. 4.

The multiplexer 60 may be arranged to selectively transmit the current induced in one of the plurality of pick-up coils 52 to the measurement coil 54 for reading with the magnetic field sensor 21. In particular, the multiplexer 60 may cycle through each of the pick-up coils 52, transmitting the current induced in each pick-up coil 52 to the measurement coil 54 in turn.

Alternatively, as described below in relation to FIG. 6, each pick-up coil 52 may be in electrical communication with its own measurement coil 54. Each measurement coil may then be measured by a corresponding magnetic field sensor 21.

Combinations of these arrangements are also possible, where the plurality of pick-up coils 52 are separated into a number of sub-groups. Each sub-group of pick-up coils 52 may be in electrical communication with a multiplexer 60, with a measurement coil 54 and magnetic field sensor 21 provided for each multiplexer.

The pick-up coils 52 may be arranged in a regular array such as shown in FIG. 4. As discussed above, the array may be evenly distributed across the face of the cell 10 to allow a full profile of the cell 10 to be generated. The array may be such as to place the pick-up coils 52 at locations where failure or deterioration of the cell 100 is expected.

Figure 5:
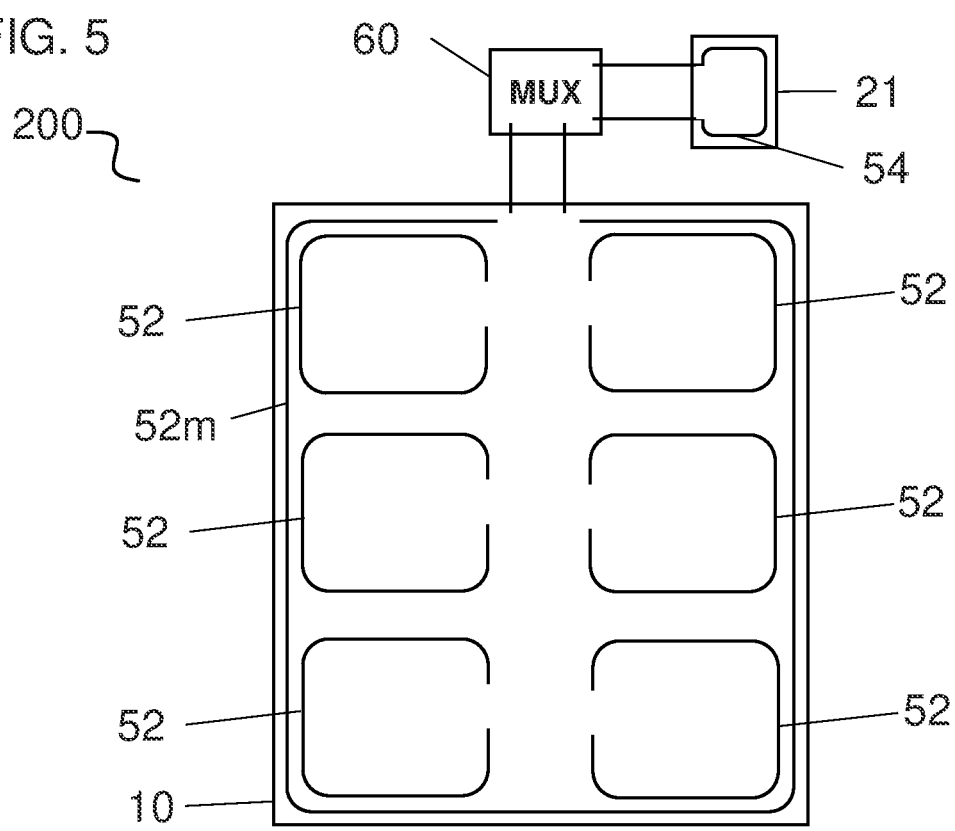
FIG. 5 shows a schematic of a further alternative arrangement of the apparatus of FIG. 3.

FIG. 5 shows a modified version of the arrangement of FIG. 4, which further includes a master pick-up coil 52. The master pick-up coil 52 is generally the same as the previously-discussed pick-up coils 52, unless expressly stated otherwise. The master pick-up coil 52$m$ surrounds the plurality of pick-up coils 52. In particular, the master pick-up coil 52$m$ may surround every other pick-up coil 52 provided on the cell 10. The master pick-up coil 52 may generally correspond to an outer perimeter of the cell 10, for example by being offset from the outer perimeter of the cell 10 by a constant amount around the entire outer perimeter.

Figure 6:
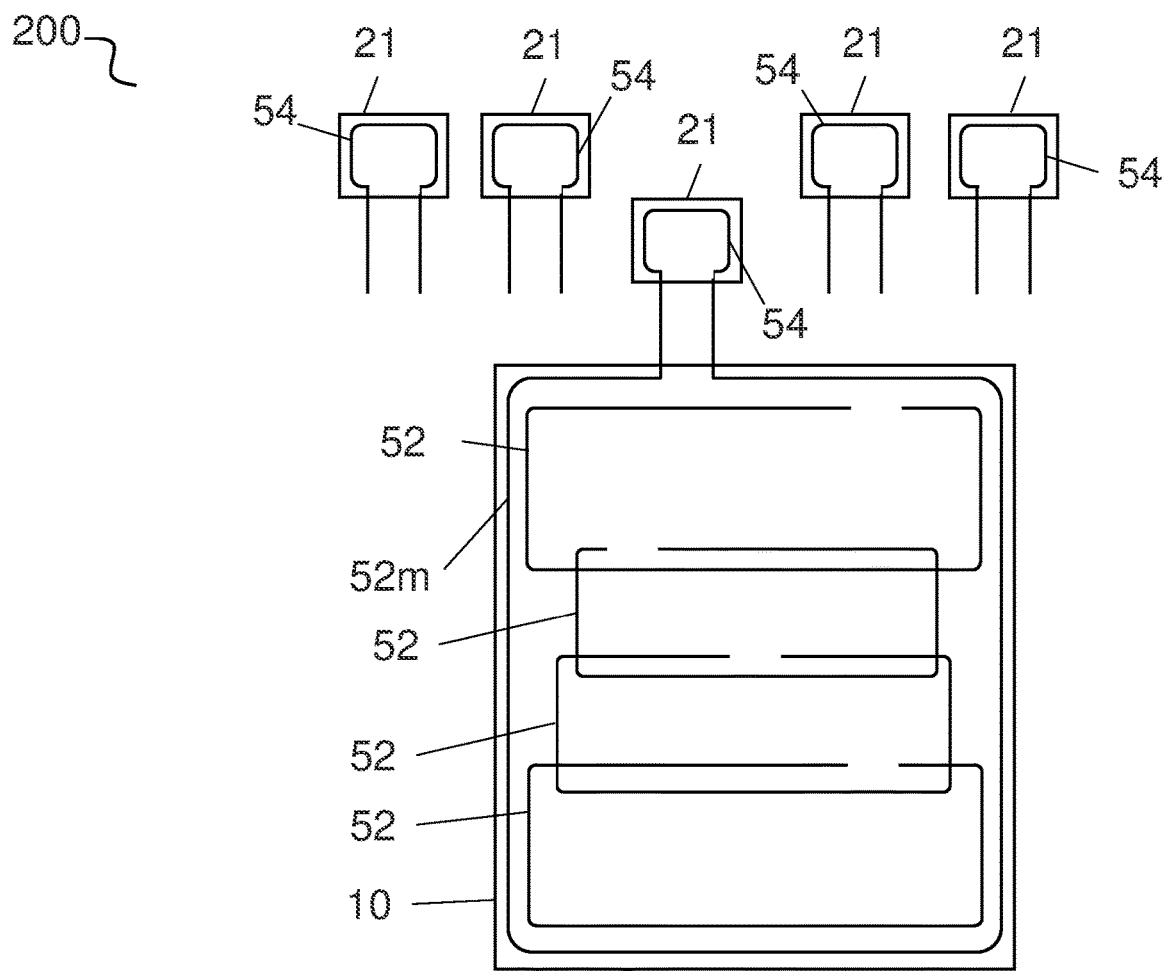
FIG. 6 shows a schematic of a further alternative arrangement of the apparatus of FIG. 3.

FIG. 6 shows a further arrangement of the apparatus 200. In this apparatus 200 the plurality of pick-up coils 52 include one or more nested pick-up coils 52. The nested pick-up coils 52 overlap another pick-up coil 52 of the plurality of pick-up coils 52. As can be seen in FIG. 6, the degree of overlap may be relatively small such as between adjacent pick-up coils 52. The master pick-up coil 52$m$ is effectively a form of nested coil, as it overlaps all of the other pick-up coils 52.

In the arrangement of FIG. 6, each pick-up coil 52 is in electrical communication with its own corresponding measurement coil 54. Again, for ease of reference the connections between pick-up coils 52 and respective measurement coils 54 are omitted from FIG. 6. Of course, the nested coils 52 arrangement of FIG. 6 may be used with an arrangement including a multiplexer 60 between the pick-up coils and one or more measurement coils 54.

The use of these nested coils 52 means that any background DC fields can be removed from the pick-up coil 52 readings. This is particularly achieved with the use of the master pick-up coil 52$m$. This may, for example, allow for removal of the background effects of the Earth's magnetic field or any caused by local surroundings. This therefore achieves a level of compensation.

The pick-up coils 52 may be arranged and/or nested in many different ways so as to provide a spatial resolution or compensation desired. The arrangement can also be selected to achieve a cost-effective arrangement which provides sufficient spatial resolution and compensation for a given use.

An assembly may be provided with the apparatus 200 combined with a cell 10. In particular, the pick-up coils 52 may be provided attached to a cell 10, such as inside the cell pouch. The external components such as the multiplexer 60, measurement coil 54, etc. may be selectively attached thereto when measurement is desired. Alternatively, the attachment may be permanent. In this sense an integrated measurable cell 10 is provided. This assembly, or any of the arrangements of FIGS. 3 to 6, may particularly be useful when the cell 10 is a car battery.

Any of the apparatuses 200 of FIGS. 3 to 6 may be connected as inputs to a battery management system and used in the control structure thereof in the same manner as described above in relation to the apparatuses 100 of FIGS. 1 and 2.

Figure 7:
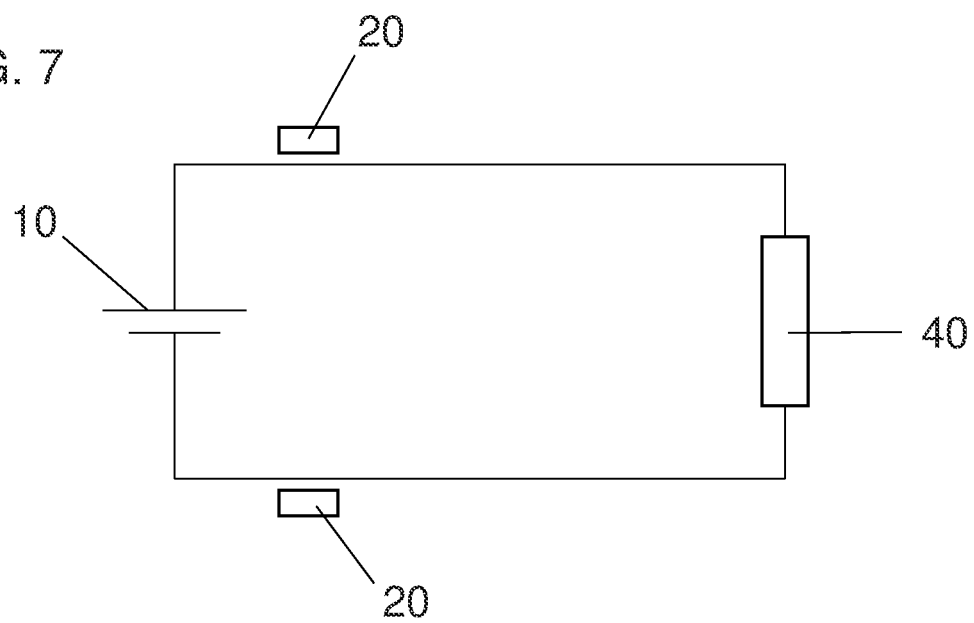
FIG. 7 shows a schematic circuit diagram of an apparatus for monitoring an input and/or an output current of a cell.

In a further embodiment, the Hall effect sensor 20 with a graphene conductor can be used to measure the input and/or output current of a cell 10, as shown in FIG. 7.

The cell 10 is connected to provide power to a load 40. The load 40 may be any element or elements that draws power from the cell 10. For example, the load 40 may be the electronics system of a vehicle and the cell 10 may be a car battery. In prior art systems, a shunt resistor is provided in series with the load 40. This shunt resistor may be provided either side of the load 40, depending on whether it is the cell 10 input or output current to be measured. A voltage drop reading across the shunt resistor is taken, and the current is calculated according to Ohms law. As the shunt resistor is provided in series with the load 40, if the shunt resistor fails this can affect or inhibit the flow of current through the load 40.

In the present disclosure, the shunt resistor is removed. Instead, one or more Hall effect sensor(s) 20 are provided on the input and/or output lines of the cell 10. These Hall effect sensor(s) 20 include a graphene conductor as described above. While FIG. 3 shows a Hall effect sensor 20 on both the input and output lines of the cell 10, this is not required. Instead, a single Hall effect sensor 20 may be provided on one of the input line or the output line of the cell 10.

Such Hall effect sensors 20 with a graphene conductor will provide greater resolution than a shunt resistor. Additionally, these Hall effect sensors 20 require a low power draw and hence will not materially affect the overall power draw for the battery management system.

Thus, the present disclosure relates to the use of a Hall effect sensor 20 with a graphene conductor to measure the input and/or output current of a cell 10.

While the present disclosure has focused upon a cell 10, it is noted that the techniques and apparatus are equally applicable to fuel cells, capacitors, batteries, battery stacks, etc.

While the present disclosure discusses a general graphene Hall effect sensor 20, it has been appreciated that the performance of the Hall effect sensor 20 can be greatly improved by using graphene manufactured in accordance with the disclosure of UK Patent Application No. 2020131.5, the entire contents of which is hereby incorporated by reference.

Such Hall effect sensors comprise a graphene conductor and a layer of dielectric material thereon which have been patterned simultaneously such that during manufacture only the outer edge of the graphene sheet is exposed. The graphene conductor may be a graphene sheet (a monolayer), or a graphene layer structure formed of 1 to 10 graphene sheets. Accordingly, the graphene and the dielectric layer share a continuous outer edge surface. The dielectric layer may be, for example, silica, hafnia or alumina, preferably alumina, formed either by evaporation or atomic layer deposition (ALD). Ohmic contacts are then deposited and therefore only contact the outer edge surface of the graphene sheet which had been found to provide markedly improved current injection into the graphene (relative to an ohmic contact on the surface of the graphene). Edge ohmic contacts also minimise the contact area with the graphene sheet thereby minimising any unwanted doping from what is typically a metal contact (such as one or more of titanium, aluminium, chromium and gold) which can otherwise limit the sensor sensitivity.

Whilst the dielectric layer provides substantial protection from atmospheric contaminates since it coats the entire graphene surface, the Hall effect sensor may further comprise a continuous air-resistant coating layer extending across the coated graphene such that at least the remaining continuous outer edge surface is coated. This fully encapsulates the graphene and to protect it from atmospheric contamination. The continuous air-resistant coating layer may also preferably be alumina or hafnia, formed by evaporation or ALD. ALD is preferable since this provides a conformal coating across the entire substrate which provides a more effective air-resistant coating. Alumina or hafnia may be patterned by evaporation but the directional nature of such a method risks some edges of the graphene remaining exposed due to shadowing. However, patterning allows the ohmic contacts to remain exposed and the streets of the substrate to remain uncoated such that dicing of the substrate may be carried out with risk of damaging the coating layer. The Hall effect sensor may be integrated into a circuit using conventional wire bonding or solder bumping to the ohmic contacts. Where a coating layer is formed by ALD, it may then be necessary to puncture the coating to reach the ohmic contact for wire bonding which risks causing damage or cracking the coating layer. In an alternative embodiment, the patterned graphene and dielectric layer are coated with an air-resistant coating layer before deposition of any ohmic contacts. The coating layer may be selectively etched to expose portions of the graphene edge whereupon ohmic contacts may be deposited in the etched portions to contact the graphene edge surface, however, there is greater complexity in depositing ohmic contacts within the selectively etched portions.

The Hall effect sensor may therefore comprise:
a substrate having a layer structure thereon, the layer structure comprising:
  a lower layer on a first region of the substrate, wherein the lower layer comprises one or more graphene layers which extend across the lower layer, and
  an upper layer on the lower layer and formed of a dielectric material,
  wherein the graphene and upper layer are cross-shaped and share a continuous outer edge surface,
an ohmic contact provided on a further region of the substrate and in direct contact with the one or more graphene layers via the continuous outer edge surface, and
four ohmic contacts, each contact provided on a further region of the substrate and in direct contact with a distal portion of the edge surface of each of the four arms of the cross, and
a continuous air-resistant coating layer enclosing the layer structure or across the substrate, the layer structure, and the at least one ohmic contact.

Arms of the cross mean the four protruding sections forming the cross.

The substrate may be sapphire, silicon, silicon dioxide, silicon nitride, silicon carbide, germanium, or a III-V semiconductor, preferably sapphire or silicon.

Preferably, the Hall effect sensor comprises:
a sapphire substrate having a layer structure thereon, the layer structure comprising:
  a monolayer of graphene on a first region of the sapphire substrate, and
  an alumina layer on the graphene monolayer,
  wherein the graphene and alumina are cross-shaped and share a continuous outer edge surface,
four gold ohmic contacts, each contact provided on a further region of the sapphire substrate and in direct contact with a distal portion of the edge surface of each of the four arms of the cross, and
a continuous alumina coating layer across enclosing the layer structure.

The protective coating layers provided by the methods disclosed in UK Patent Application No. 2020131.5 provide the graphene of the graphene Hall effect sensor with excellent protection from atmospheric contamination leading to improved stability of device performance over longer periods of time when compared to other known Hall effect sensors thereby extending device lifetime and minimising any need for recalibration of the device. Such Hall effect sensors produce an instant sensor response that allows the real-time monitoring of current density across the cell 10.

It has been further appreciated that for any Hall effect sensor 20 discussed above, the reliability of the measurements can be increased by incorporating a spinning current modulation technique. A suitable technique is discussed in "*A Spinning Current Circuit for Hall Measurements Down to the Nanotesla Range*" of Mosser et al. This allows a dynamic cancellation of offset and low-frequency noise by quickly and periodically exchanging the bias and sense terminals of the Hall effect sensor. This may be used in connection with any of the arrangements and embodiments discussed above.

The invention claimed is:
1. A method of field mapping a cell under load comprising the steps of:
  providing a cell;
  providing a Hall effect sensor comprising a graphene conductor for measuring a magnetic field;
  positioning the Hall effect sensor at a first position adjacent a face of the cell;
  applying a load to the cell; and
  measuring an output of the Hall effect sensor to detect a magnetic field produced by the cell in a portion of the cell aligned with the first position,
  wherein the Hall effect sensor comprises:
    a substrate having a layer structure thereon, the layer structure comprising:
      a lower layer on a first region of the substrate, wherein the lower layer comprises one or more graphene layers which extend across the lower layer, and
      an upper layer of the lower layer and formed of a dielectric material, wherein the graphene and upper layer share a continuous outer edge surface;
    an ohmic contact provided on a further region of the substrate and in direct contact with the one or more graphene layers via the continuous outer edge surface; and
    a continuous air-resistant coating layer enclosing the layer structure or across the substrate, the layer structure, and the ohmic contact.
2. The method of claim 1, further comprising the steps of:
  moving the Hall effect sensor from the first position to a second position adjacent the face of the cell; and measuring the output of the Hall effect sensor at the second location to detect a magnetic field produced by the cell in a portion of the cell aligned with the second position.

3. The method of claim 2, further comprising the steps of: moving the Hall effect sensor from the second position to a series of N subsequent positions adjacent the face of the cell; and
measuring the output of the Hall effect sensor at each of the subsequent positions to detect a magnetic field produced by the cell in portions of the cell aligned with the subsequent position,
wherein the N subsequent positions are distributed across the surface of the cell.

4. The method of claim 3, wherein the N subsequent positions form an array across the face of the cell.

5. The method of claim 1, wherein the Hall effect sensor is a part of an array of Hall effect sensors, each of which is placed adjacent the cell so as to detect a magnetic field produced by the cell in a corresponding portion of the cell aligned with the Hall effect sensor.

6. The method of claim 1, further comprising the steps of:
monitoring the measured output of the Hall effect sensor;
identifying a change in the magnetic field indicative of cell failure; and
determining a location in the cell of the cell failure.

7. The method of claim 1, wherein the Hall effect sensor comprises:
four ohmic contacts, each contact provided on a further region of the substrate and in direct contact with a distal portion of the continuous edge surface.

8. The method of claim 1, wherein the substrate is sapphire, silicon, silicon dioxide, silicon nitride, silicon carbide, germanium, or a III-V semiconductor.

9. The method of claim 1, further comprising the step of converting the magnetic field to a local current density.

10. The method of claim 1, wherein the dielectric material is silica, hafnia or alumina.

11. The method of claim 1, wherein the air resistant coating layer is alumina or hafnia.

12. An apparatus for field mapping a cell under load comprising an array of Hall effect sensors, each Hall effect sensor comprising:
a graphene conductor for measuring a magnetic field in a corresponding portion of the cell aligned in use with the Hall effect sensor;
a substrate having a layer structure thereon, the layer structure comprising:
a lower layer on a first region of the substrate, wherein the lower layer comprises one or more graphene layers which extend across the lower layer, and
an upper layer on the lower layer and formed of a dielectric material, wherein the graphene and upper layer share a continuous outer edge surface,
an ohmic contact provided on a further region of the substrate and in direct contact with the one or more graphene layers via the continuous outer edge surface; and
a continuous air-resistant coating layer enclosing the layer structure or across the substrate, the layer structure, and the ohmic contact.

13. The apparatus of claim 12, wherein the Hall effect sensor comprises:
four ohmic contacts, each contact provided on a further region of the substrate and in direct contact with a distal portion of the continuous edge surface.

14. The apparatus of claim 12, wherein the substrate is sapphire, silicon, silicon dioxide, silicon nitride, silicon carbide, germanium, or a III-V semiconductor.

15. The apparatus of claim 12, wherein the dielectric material is silica, hafnia or alumina.

16. The apparatus of claim 12, wherein the air resistant coating layer is alumina or hafnia.

17. An apparatus for field mapping a cell under load comprising a Hall effect sensor mounted on an actuation system, the actuation system configured to move the Hall effect sensor between a plurality of positions corresponding to locations on the cell, the Hall effect sensor comprising:
a graphene conductor for measuring a magnetic field in a corresponding portion of the cell aligned in use with the Hall effect sensor;
a substrate having a layer structure thereon, the layer structure comprising:
a lower layer on a first region of the substrate, wherein the lower layer comprises one of more graphene layers which extend across the lower layer, and
an upper layer on the lower layer and formed of a dielectric material, wherein the graphene and upper layer share a continuous outer edge surface,
an ohmic contact provided on a further region of the substrate and in direct contact with the one or more graphene layers via the continuous outer edge surface; and
a continuous air-resistant coating layer enclosing the layer structure or across the substrate, the layer structure, and the ohmic contact.

18. The apparatus of claim 17, wherein the Hall effect sensor comprises:
four ohmic contacts, each contact provided on a further region of the substrate and in direct contact with a distal portion of the continuous edge surface.

19. The apparatus of claim 17, wherein the dielectric material is silica, hafnia or alumina.

20. The apparatus of claim 17, wherein the air resistant coating layer is alumina or hafnia.

* * * * *